United States Patent
Bag et al.

(10) Patent No.: US 9,368,660 B2
(45) Date of Patent: Jun. 14, 2016

(54) CAPPING LAYERS FOR IMPROVED CRYSTALLIZATION

(75) Inventors: Santanu Bag, Yorktown Heights, NY (US); David Aaron Randolph Barkhouse, New York, NY (US); David Brian Mitzi, Mahopac, NY (US); Teodor Krassimirov Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 719 days.

(21) Appl. No.: 13/207,269

(22) Filed: Aug. 10, 2011

(65) Prior Publication Data

US 2013/0037090 A1 Feb. 14, 2013

(51) Int. Cl.
*B05D 5/12* (2006.01)
*H01L 31/032* (2006.01)

(52) U.S. Cl.
CPC ............. *H01L 31/0326* (2013.01); *Y02E 10/50* (2013.01); *Y10T 428/31678* (2015.04)

(58) Field of Classification Search
USPC ...................................... 427/76, 78
See application file for complete search history.

(56) References Cited

U.S. PATENT DOCUMENTS

| 7,838,403 B1 | 11/2010 | Liu et al. |
| 2007/0092648 A1 | 4/2007 | Duren et al. |
| 2008/0280030 A1* | 11/2008 | Van Duren et al. ............. 427/74 |
| 2011/0094557 A1 | 4/2011 | Mitzi et al. |
| 2011/0097496 A1 | 4/2011 | Mitzi et al. |
| 2012/0168910 A1* | 7/2012 | Jackrel et al. ................. 257/613 |
| 2012/0313044 A1* | 12/2012 | Kuwahara et al. ...... 252/301.6 S |

FOREIGN PATENT DOCUMENTS

| CN | 101452969 A | 6/2009 |
| WO | WO 2010/138636 | * 12/2010 |
| WO | WO 2011066205 A1 | 6/2011 |

OTHER PUBLICATIONS

M. Powalla et al., "Large-Area CIGS Modules: Pilot Line Production and New Developments," International PVSEC-14, Bangkok, Thailand, Jan. 26-30, 2004; IN28V/18-1.
S. Chen, "Compositional dependence of structural and electronic properties of Cu2ZnSn(S,Se)4 alloys for thin film solar cells," Physical Review B, 83, 125201 (2011).

(Continued)

*Primary Examiner* — Austin Murata
(74) *Attorney, Agent, or Firm* — Vazken Alexanian; Michael J. Chang, LLC

(57) ABSTRACT

Techniques for fabrication of kesterite Cu—Zn—Sn—(Se,S) films and improved photovoltaic devices based on these films are provided. In one aspect, a method of fabricating a kesterite film having a formula $Cu_{2-x}Zn_{1+y}Sn(S_{1-z}Se_z)_{4+q}$, wherein $0 \le x \le 1$; $0 \le y \le 1$; $0 \le z \le 1$; and $-1 \le q \le 1$ is provided. The method includes the following steps. A substrate is provided. A bulk precursor layer is formed on the substrate, the bulk precursor layer comprising Cu, Zn, Sn and at least one of S and Se. A capping layer is formed on the bulk precursor layer, the capping layer comprising at least one of Sn, S and Se. The bulk precursor layer and the capping layer are annealed under conditions sufficient to produce the kesterite film having values of x, y, z and q for any given part of the film that deviate from average values of x, y, z and q throughout the film by less than 20 percent.

21 Claims, 6 Drawing Sheets

(56) References Cited

OTHER PUBLICATIONS

Schorr, "The crystal structure of kesterite type compounds: A neutron and x-ray diffraction study," Solar Energy Materials and Solar Cells, vol. 95, 1482-1488 (2011).

A. Redinger et al., "The Consequences of Kesterite Equilibria for Efficient Solar Cells," J. Am. Chem. Soc., 133 (10), pp. 3320-3323 (2011).

D.B. Mitzi et al., "The path towards a high-performance solution-processed kesterite solar cell," Solar Energy Materials & Solar Cells, 95, 1421-1436 (2011).

H. Katagiri et al., "Development of CZTS-based thin film solar cells," Thin Solid Films 517, 2455-2460 (2009).

T. Todorov et al., "High-Efficiency Solar Cell with Earth-Abundant Liquid-Processed Absorber," Adv. Mater. 22, E156-E159 (2010).

English Machine Translation of CN101452969A by Junhao Chu et al., Jun. 10, 2009.

* cited by examiner

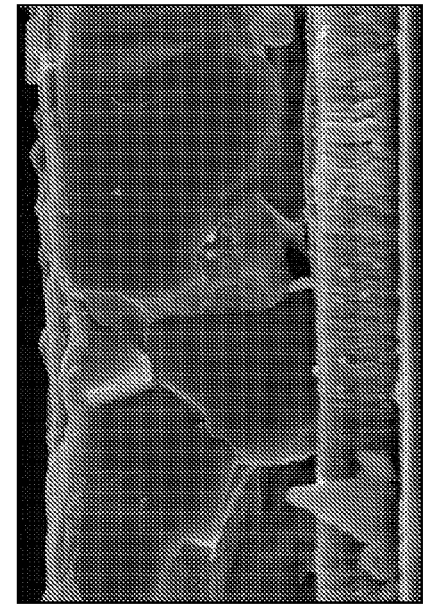
FIG. 6
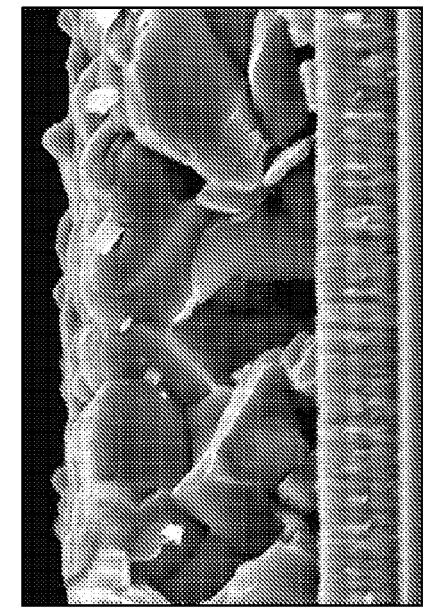
FIG. 8
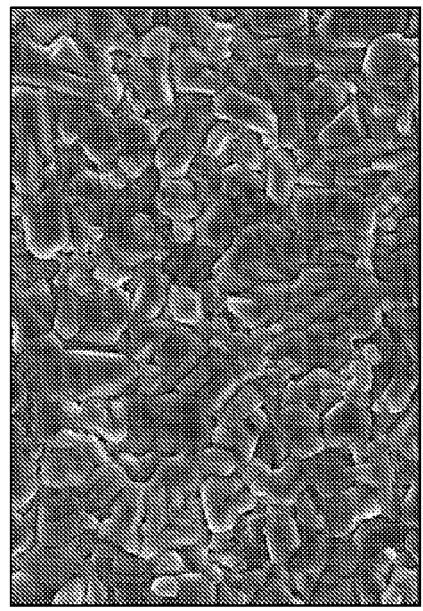
FIG. 5
FIG. 7

CAPPING LAYERS FOR IMPROVED CRYSTALLIZATION

FIELD OF THE INVENTION

The present invention relates to improving properties of inorganic films having copper (Cu), zinc (Zn), tin (Sn) and at least one of sulfur (S) and selenium (Se) and more particularly, to techniques for fabrication of kesterite Cu—Zn—Sn—(Se,S) films and improved photovoltaic devices based on these films.

BACKGROUND OF THE INVENTION

The widespread implementation of next generation ultra-large scale photovoltaic technologies (beyond 100 gigawatt peak (GWp)) will require drastically reducing production costs and achieving high efficiency devices using abundant, environmentally friendly materials. Thin-film chalcogenide-based solar cells provide a promising pathway to cost parity between photovoltaic and conventional energy sources. Currently, only $Cu(In,Ga)(S,Se)_2$ and CdTe technologies have reached commercial production and offer over 10 percent power conversion efficiency. These technologies generally employ (i) indium (In) and tellurium (Te), which are relatively rare elements in the earth's crust, or (ii) cadmium (Cd), which is a highly toxic heavy metal.

Copper-zinc-tin-chalcogenide kesterites, with the ideal formula $Cu_2ZnSn(S,Se)_4$ (CZTSSe), more generally expressed as $Cu_{2-x}Zn_{1+y}Sn(S_{1-z}Se_z)_{4+q}$, wherein $0 \leq x \leq 1$; $0 \leq y \leq 1$; $0 \leq z \leq 1$; $-1 \leq q \leq 1$, have been investigated as potential alternatives because they are based on readily available and lower cost elements. However, photovoltaic cells with kesterites, even when produced using high cost vacuum-based methods, had until recently achieved at best only 6.7 percent power conversion efficiencies, see H. Katagiri et al., "Development of CZTS-based thin film solar cells," Thin Solid Films 517, 2455-2460 (2009).

U.S. Patent Application Publication No. 2011/0094557 A1 filed by Mitzi et al., entitled "Method of Forming Semiconductor Film and Photovoltaic Device Including the Film," (hereinafter "U.S. Patent Application Publication No. 2011/0094557 A1") and T. Todorov et al., "High-Efficiency Solar Cell with Earth-Abundant Liquid-Processed Absorber," Adv. Mater. 22, E156-E159 (2010), describe a hydrazine-based approach for depositing homogeneous chalcogenide layers from mixed slurries containing both dissolved and solid metal chalcogenide species dispersed in systems that do not require organic binders. Upon anneal, the particle-based precursors readily react with the solution component and form large-grained films with good electrical characteristics and device power conversion efficiencies as high as 10%.

However, favorable electronic properties of these materials are found in a relatively narrow compositional range, i.e., Cu/(Zn+Sn)=0.7-0.9 and Zn/Sn=1-1.3. See, for example, H. Katagiri et al., "Development of CZTS-based thin film solar cells," Thin Solid Films, 517, 2455-2460 (2009).

A common challenge found in kesterite layer fabrication is the volatile nature of film constituents at high temperature, such as tin (Sn) chalcogenide compounds. See, for example, D. B. Mitzi et al., "The path towards a high-performance solution-processed kesterite solar cell," Solar Energy Materials & Solar Cells, 95, 1421-1436 (2011). This property makes it particularly difficult to fabricate films with desirable composition and large-grained structure at elevated temperatures.

In addition to Sn compounds, chalcogenides (sulfur (S) and selenium (Se)) are volatile at relatively low temperatures. Their beneficial effect on film crystallization has been known in CIGS films. See U.S. Patent Application Publication No. 2007/0092648 A1, filed by Duren et al., entitled "Chalcogenide Solar Cells." This approach of extra chalcogen in the film can be extended to CZTS and has been applied in the teachings of U.S. Patent Application Publication No. 2011/0094557 A1 and U.S. Patent Application Publication No. 2011/0097496 A1, filed by Mitzi et al., entitled "Aqueous-Based Method of Forming Semiconductor Film and Photovoltaic Device Including the Film" (hereinafter "U.S. Patent Application Publication No. 2011/0097496 A1") for all of the 5 deposited layers. Yet excess of chalcogen in the bulk of the film may lead to the occurrence of voids and cracks.

There are reports employing an anneal atmosphere containing tin-sulfur/selenium vapor in a sealed glass ampoule, including a device efficiency of 5.4%. See, for example, A. Redinger et al., "The Consequences of Kesterite Equilibria for Efficient Solar Cells," J. Am. Chem. Soc., 133 (10), pp 3320-3323 (2011). However, precise process control in this configuration may not be straightforward in large-area applications.

Thus, improved techniques for the fabrication of kesterite layers would be desirable. In particular, improved techniques for controlling the concentration and gradient of volatile elements Sn, S and Se within the bulk CZTSSe film are required in order to target improved device performance.

SUMMARY OF THE INVENTION

The present invention provides techniques for fabrication of kesterite Cu—Zn—Sn—(Se,S) films and improved photovoltaic devices based on these films. In one aspect of the invention, a method of fabricating a kesterite film having a formula $Cu_{2-x}Zn_{1+y}Sn(S_{1-z}Se_z)_{4+q}$, wherein $0 \leq x \leq 1$; $0 \leq y \leq 1$; $0 \leq z \leq 1$; and $-1 \leq q \leq 1$ is provided. The method includes the following steps. A substrate is provided. A bulk precursor layer is formed on the substrate, the bulk precursor layer comprising Cu, Zn, Sn and at least one of S and Se. A capping layer is formed on the bulk precursor layer, the capping layer comprising at least one of Sn, S and Se. The bulk precursor layer and the capping layer are annealed under conditions sufficient to produce the kesterite film having values of x, y, z and q for any given part of the film that deviate from average values of x, y, z and q throughout the film by less than 20 percent.

A more complete understanding of the present invention, as well as further features and advantages of the present invention, will be obtained by reference to the following detailed description and drawings.

BRIEF DESCRIPTION OF THE DRAWINGS

FIG. 5 is a surface scanning electron micrograph (SEM) image of a base-line film prepared without using a capping layer according to an embodiment of the present invention;

FIG. 6 is a surface SEM image of a film prepared using a capping layer according to an embodiment of the present invention;

FIG. 7 is a cross-sectional SEM image of a completed baseline device using the film of FIG. 5 (without a capping layer) according to an embodiment of the present invention;

FIG. 8 is a cross-sectional SEM image of a completed device using the film of FIG. 6 (with a capping layer) according to an embodiment of the present invention;

DETAILED DESCRIPTION OF PREFERRED EMBODIMENTS

Provided herein are techniques for improving morphology and bulk composition of films composed, for example, of copper (Cu), zinc (Zn), tin (Sn), sulfur (S) and/or selenium (Se), including those having a kesterite crystal structure, e.g., $Cu_2ZnSnS_4$ or $Cu_2ZnSnSe_4$, through the use of a solid capping layer containing Sn and or a chalcogen (S or Se) which serves to compensate for loss of these elements during the high-temperature reactions (e.g., which typically occurs at temperatures above 400 degrees Celsius (° C.)) of kesterite crystallization. The use of a solid capping layer, rather than a vapor-phase addition process, can be advantageous because the solid layer may provide at least temporarily molten Se-rich compositions during the high-temperature treatment that may assist in recrystallizing the chalcogenide-based thin film (leading to improved grain structure) and, as well, act as a temporary capping layer to reduce the probability of elemental loss during the high temperature treatment (leading to better phase purity in the film). For a general discussion on kesterite and use of kesterite in solar cells, see for example, Schorr, "The crystal structure of kesterite type compounds: A neutron and x-ray diffraction study," Solar Energy Materials and Solar Cells, vol. 95, 1482-1488 (2011), the entire contents of which is incorporated by reference herein.

Figure 1:
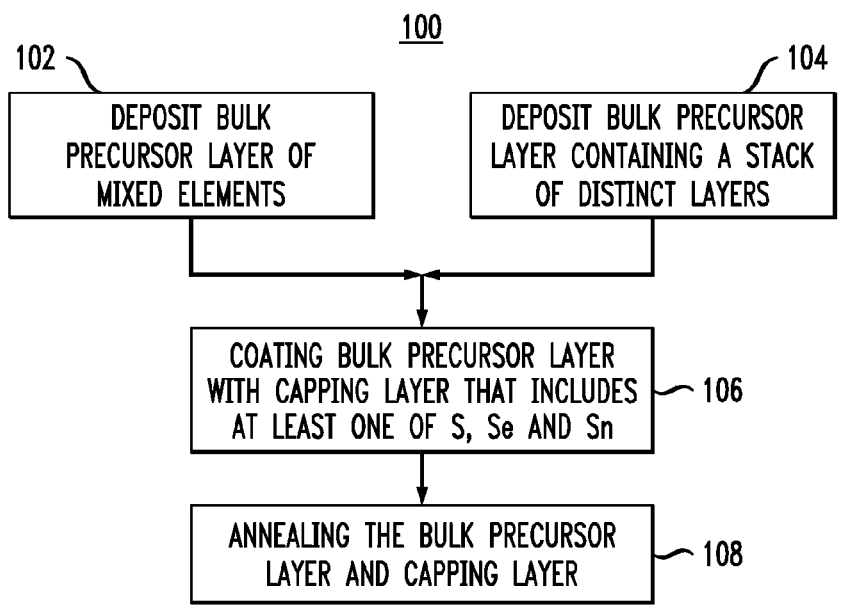
FIG. 1 is a diagram illustrating an exemplary methodology for fabricating a kesterite film according to an embodiment of the present invention.

FIG. 1 is a diagram illustrating an exemplary methodology 100 for fabricating inorganic films having copper (Cu), zinc (Zn), tin (Sn) and at least one of sulfur (S) and selenium (Se), such as kesterite Cu—Zn—Sn—(Se,S) films. In the following description, when components are defined as containing elements, it is to be understood that these elements can be present in either isolated or compound form, (e.g., a Sn-containing component can comprise Sn, SnS, $SnS_2$, SnO, $Sn(OH)_2$ or any other known Sn compound).

The desired end product of the process is a kesterite film of the formula

$$Cu_{2-x}Zn_{1+y}Sn(S_{1-z}Se_z)_{4+q},\qquad(1)$$

wherein $0 \le x \le 1$; $0 \le y \le 1$; $0 \le z \le 1$; and $-1 \le q \le 1$, e.g., wherein x, y, z and q respectively are: $0 \le x \le 0.5$; $0 \le y \le 0.5$; $0 \le z \le 1$; $-0.5 \le q \le 0.5$. To begin the process, a bulk precursor layer is formed on a given substrate. The term "bulk" refers to the fact that the components of this layer will make up the bulk or majority of the kesterite film, with the capping layer (to be formed below) serving primarily to replace elements lost from the bulk precursor layer during the high temperature crystallization anneal. The term "precursor" refers to the fact that the final composition and/or distribution of elements throughout the kesterite film will be established only after the capping layer is in place and a crystallization anneal has been performed. Thus, the elements as they presently exist in the bulk layer are at this stage merely precursors for the final kesterite film formation.

According to an exemplary embodiment, the bulk precursor layer will contain at least some of each of the elements that will make up the end-product kesterite film. Thus, in this example, given Formula 1 above, the bulk precursor layer may contain Cu, Zn, Sn and at least one of S and Se (and in some cases may itself form a kesterite phase material, see below). Alternatively, the bulk precursor layer may have only some of the component elements, e.g., only Cu, Zn, S and/or Se (no Sn). The Sn in this case will be provided by the capping layer. Further, since (as will be described in detail below) the capping layer will contain Sn, S and/or Se to supplement and/or provide the Sn, S and/or Se lost during the final anneal, the bulk precursor layer will be the source of the Cu and Zn present in the final film.

There are two main advantages of the capping layer. First, as mentioned above, the capping layer serves to compensate for the elemental loss due to evaporation (especially critical for the metal ratio, i.e., the Sn content) during the final anneal. Second, the capping layer provides additional elemental chalcogen at the surface of the film that promotes crystallization without forming voids in the bulk of the layer, in contrary to excess chalcogen added in the bulk layer(s).

As will be described in detail below, the present techniques may be used to form a kesterite absorber layer for a photovoltaic device. In that case, suitable substrates include, but are not limited to, a metal foil substrate, a glass substrate, a ceramic substrate, aluminum foil coated with a (conductive) layer of molybdenum, a polymer substrate, and any combination thereof. For photovoltaic device applications, it is preferable that the substrate is coated with a conductive coating/layer (such as a molybdenum layer) if the substrate material itself is not inherently conducting. The conductive coating/layer or substrate can, in that instance, serve as an electrode of the device.

The bulk precursor layer may be formed by depositing its constituent elements (i.e., Cu, Zn, optionally Sn and at least one of S and Se) either all together or sequentially. As shown in FIG. 1, the bulk precursor layer can be configured in a number of different ways. By way of example only, in step 102, the bulk precursor layer is made up of a layer of mixed elements. As highlighted above, the bulk precursor layer may contain at least some of each of the elements that will make up the end-product kesterite film. Thus, in this case, the bulk precursor layer includes Cu, Zn, Sn and at least one of S and Se. To form the bulk precursor layer having each of these elements, one or more of Cu, Zn, Sn, S, Se, binary metal chalcogenides such as $Cu_2S$, $Cu_2Se$, $Cu_2(S,Se)$, SnS, SnSe, Sn(S,Se), $SnS_2$, $SnSe_2$, $Sn(S,Se)_2$, ZnS, ZnSe, Zn(S,Se), ternary metal chalcogenides such as $Cu_2SnS_3$, $Cu_2SnSe_3$, $Cu_2Sn(S,Se)_3$, quaternary metal chalcogenides such as $Cu_2ZnSnS_4$, $Cu_2ZnSnSe_4$ and $Cu_2ZnSn(S,Se)_4$, and combinations including at least one of the foregoing elements/metal chalcogenides may be dissolved or dispersed as particles in a suitable solvent (such as hydrazine or a hydrazine-water mixture, with hydrazine content from about 0.1% to about 99.9%) and then deposited on the substrate to form the mixed element bulk precursor layer. Any suitable deposition process known in the art may be used, including, but not limited to, solution coating, evaporation, electrochemical deposition and sputtering.

In one exemplary embodiment, the bulk precursor layer is formed using the techniques described in U.S. Patent Application Publication No. 2011/0094557 A1 and U.S. Patent Application Publication No. 2011/0097496 A1, the entire contents of each of which are incorporated by reference herein. By way of example only, using the techniques described in U.S. Patent Application Publication No. 2011/0094557 A1 and U.S. Patent Application Publication No. 2011/0097496 A1, a solution A would be prepared containing hydrazine, Cu and at least one of S and Se (depending on the desired final composition), a dispersion B would be prepared containing hydrazine, Sn, Zn and at least one of S and Se (depending on the desired final composition), the components A and B would be mixed together to form an ink and the ink would be deposited using any suitable solution-based deposition process (including, but not limited to, spin coating, dip coating, doctor blading, curtain coating, slide coating, spraying, slit casting, meniscus coating, screen printing, ink jet printing, pad printing, flexography, and gravure printing). Techniques for forming an ink are also described in U.S. Patent Application Publication No. 2013/0037111, filed herewith on the same day of Aug. 10, 2011, entitled "Process for Preparation of Elemental Chalcogen Solutions and Methods of Employing Said Solutions in Preparation of Kesterite Films," and in U.S. Patent Application Publication No. 2013/0037110, filed herewith on the same day of Aug. 10, 2011, entitled "Particle-Based Precursor Formation Method and Photovoltaic Device Thereof," the entire contents of each of which are incorporated by reference herein. After a brief heat treatment, the result is a bulk precursor layer of mixed elements. To increase a thickness of the bulk precursor layer, the above process of deposition and short heat treatment may be repeated until the desired thickness is attained. The short heat treatment prevents successive layers from being dissolved when the next layer of solution deposition is performed. The temperature of this short (intermediate) heat treatment is preferably less than the final anneal (see, for example, step 108 described below).

At this point in the process, a composition of the bulk precursor layer may be outside of the compositional range of stability for the kesterite phase. In the most extreme example, the film may contain only Cu, Zn, S and/or Se (no Sn). In this case the precursor film is not kesterite until the Sn is provided by the capping layer (see below). A kesterite phase implies a certain crystal structure, which is stable only over a limited range of Cu—Zn—Sn—S—Se stoichiometry and heat treatment conditions. Alternatively, the bulk precursor layer may already at this stage have the correct stoichiometry and may be heat treated sufficiently (i.e., enough to stabilize the kesterite phase and enable grain growth) to yield the kesterite phase (although the heat treatment conditions might not be optimal, for example, as related to the heat treatment time and duration parameters given below for the final anneal (see description of step 108)). However, the bulk precursor layer would either, for example, not yet have an optimal composition within the kesterite phase for high performance or, for example, would have an optimal composition but still be susceptible of losing volatile elements from its surface during the final anneal (see description of step 108). A purpose of the capping layer and final anneal (see below) then is to improve on the final film bulk and surface composition, grain structure or homogeneity).

When, as described immediately above, the bulk precursor layer already has the correct stoichiometry and has been heat treated to yield the kesterite phase, the bulk precursor layer is referred to herein as having a "nominal" kesterite phase and configuration. The term "nominal" means that the film is predominantly the kesterite phase (there may still be impurity phases present in the film at this point, given slight variation away from ideal kesterite composition and/or heat treatment conditions). This can be improved upon during the capping and heat treatment process described below.

Alternatively, in step 104, the bulk precursor layer is composed of multiple layers. Specifically, in this example, the bulk precursor layer is actually made up of a plurality of individual layers deposited in a stack on the substrate. Each of the individual layers contains one or more precursor components that will be used to form the kesterite film. Using a simple example (wherein as described above the bulk precursor layer contains at least some of each of the elements that will make up the end-product kesterite film), the stack of layers could include one layer containing Cu, one layer containing Zn, one layer containing Sn and another layer(s) containing S and/or Se. Since the components in the layers will be interdiffused during the anneal, the particular order in which the layers appear in the stack may not be important. In some cases, however, one may want to put the least volatile elements on top to reduce evaporation during the heat treatment and/or to place the element on the bottom of the stack that is least reactive with the back contact material in the device. The thickness of the layers can be tailored based on a desired amount of the given precursor in the final product. For instance, if it is desirable to have twice as much Cu as Zn, then the Cu layer can be deposited to about twice the thickness of the Zn layer. The layers can be deposited on the substrate using any suitable deposition process, including, but not limited to solution coating, evaporation, electrochemical deposition and sputtering. Alternatively, rather than each layer containing a single element, one or more layers in the stack may include, e.g., any of the binary metal chalcogenides and/or ternary metal chalcogenides provided above.

In one exemplary embodiment, individual layers for use in forming the bulk precursor layer are deposited using the electroplating techniques described in U.S. patent application Ser. No. 12/878,746, filed by Ahmed et al., entitled "Structure and Method of Fabricating a CZTS Photovoltaic Device by Electrodeposition," (hereinafter "U.S. patent application Ser. No. 12/878,746") the entire contents of which are incorporated by reference herein. U.S. patent application Ser. No. 12/878,746 discloses electrodeposition of components of an absorber layer as distinct layers in a stack, and then forming the absorber layer through the use of an anneal step(s) to interdisperse the materials throughout the layers.

According to an exemplary embodiment, whichever bulk precursor layer configuration is employed (i.e., mixed element or distinct layers), the composition of the bulk precursor layer approximates the desired final composition of the kesterite film as per Formula 1, above. By way of example only, the bulk precursor layer preferably is within 50% tolerance or less, and more preferably within 20% tolerance of the values for x, y, z and q given in Formula 1 for the targeted composition of the kesterite film. The values of x, y, z and q in the bulk precursor layer are achieved by controlling the ratio of the elements either in the solutions or dispersions used for liquid-based deposition or by the ratio of elements deposited on the substrate using electroplating, solution coating, vacuum-based deposition, evaporation and sputtering techniques. Additionally, control over composition in the bulk precursor layer is provided by what temperature, time, atmosphere conditions are used during the heat treatment conditions used before depositing the capping layer (e.g., higher temperature, longer times and with an open flow of gas during this heat treatment will lead to more loss of Sn and S and/or Se compared to lower temperature, shorter times and a closed atmosphere). By way of example only, the bulk layer is formed to a thickness of from about 100 nanometers (nm) to about 5 micrometers ($\mu$m), for example, from about 500 nm to about 3 $\mu$m, e.g., from about 1,000 nm to about 2.5 $\mu$m.

In step 106, a capping layer that contains at least one of Sn, S and Se is formed on the bulk precursor layer. Thus, the capping layer is from 0% to 100% S, from 0% to 100% Se and/or from 0% to 100% Sn. According to an exemplary embodiment, the capping layer is from about 50% to about 90% Se, from about 1% to about 50% S and/or from about 1% to about 50% Sn. The targeted composition of Sn, Se, S, as well as the thickness of the capping layer is determined, in part, by the composition of the bulk precursor layer (as determined, for example, by Rutherford Backscattering or RBS, Medium Energy Ion Scattering or MEIS, Energy Dispersive Spectroscopy or EDS, and X-ray Florescence or XRF). For example, if the bulk precursor layer is primarily deficient in Sn, then more Sn-compound will be used in the capping layer. In general, at least enough S or Se will be included in the capping layer to accommodate Sn in the +4 valence state (i.e., providing a 2:1 ratio of Se or S to Sn) in this layer. This is done in order to avoid pulling S or Se from the bulk precursor layer to convert the Sn to the +4 state during the heat treatment process (which would then possibly lead to a S or Se deficient final film). Additional chalcogen can also be added to the Sn composition in the capping layer (or alone without any Sn composition if the bulk precursor layer is already Sn-rich) to provide a molten chalcogen-rich layer during the final heat treatment process, which is believed to help promote large grain size through recrystallization of the film. Note that if excess Sn, Se or S is provided in the capping layer (beyond what is required to satisfy the stoichiometry requirements of the kesterite film), the excess may be removed by heating up the film to a sufficient temperature (so that these elements have a sufficient vapor pressure) and for a sufficient time to evaporate the excess from the surface of the film. Nevertheless, ideally the thickness of the capping layer and particularly the amount of Sn (least volatile element) is maintained at a low enough level that the majority of Sn can either incorporate into the film, or effectively maintain sufficient vapor pressure to compensate for the typically observed Sn evaporation loss during the high-temperature anneal step.

According to an exemplary embodiment, to form the capping layer, appropriate amounts of S, Se and/or Sn (or compounds thereof, e.g., SnS, SnSe, Sn(S,Se), $SnS_2$, $SnSe_2$, $Sn(S,Se)_2$) are dissolved in a solvent to form an ink. Suitable solvents include, but are not limited to, hydrazine and hydrazine-water mixtures with hydrazine content from about 0.1% to about 99.9%. According to an exemplary embodiment, the ink solution is prepared from a solvent containing from about 1% to about 40% hydrazine by volume, and from about 1% to about 40% Se, from about 0% to about 40% Sn and from about 1% to about 40% S (atomic % for the Sn, S and Se). The concentration of the metals and chalcogens in the capping layer solution is from about 0.01M to about 5 M.

The resulting solution (ink) is then deposited onto the bulk precursor layer using any conventional deposition process, including, but not limited to, spin coating, dip coating, doctor blading, curtain coating, slide coating, spraying, slit casting, meniscus coating, screen printing, ink jet printing, pad printing, flexography, and gravure printing. By way of example only, the capping layer is formed to a thickness of from about 10 nm to about 3 $\mu$m, for example, from about 50 nm to about 1 $\mu$m, e.g., from about 100 nm to about 600 nm.

In step 108, the bulk precursor layer and the capping layer are annealed under conditions sufficient to form a kesterite film having a nominally uniform composition throughout. Namely, the annealing step serves to intersperse the elements throughout the layer (or layers) making up the bulk precursor layer and the capping layer. The term "nominally uniform," as used herein, means that there is less than a 20% difference in the atomic ratios of elements across the film thickness. This means that if one takes the average composition of the film across the absorber layer thickness (excluding the interfacial layer of, for example, $MoS_2$ or $MoSe_2$ that typically forms at the back of the chalcogenide-based absorber layer), the composition of each element of the film at any point in the bulk of the film (excluding the top and bottom 100 nm) deviates by less than 20% from the average value (which is also the targeted kesterite composition in terms of x, y, z and q). The bulk composition of the film can be determined by, for example Rutherford Backscattering or RBS, Medium Energy Ion Scattering or MEIS, Energy Dispersive Spectroscopy or EDS and X-ray Florescence or XRF). The elemental distribution with thickness in the film can be determined by, for example, secondary ion mass spectroscopy (SIMS) or EDS profiling using transmission electron microscopy (TEM).

The designation of a nominally uniform composition of the kesterite film within 20% after anneal is used to indicate the indiffusion (i.e., elements diffusing in to the bulk layer from the capping layer) and/or evaporation of elements from the capping layer and may include possible composition gradient within this limit, optionally resulting in band-gap grading and improved device performance. As described in S. Chen, "Compositional dependence of structural and electronic properties of $Cu_2ZnSn(S,Se)_4$ alloys for thin film solar cells," Physical Review B, 83, 125201 (2011), the entire contents of which are incorporated by reference herein, the band gap in $Cu_{2-x}Zn_{1+y}Sn(S_{1-z}Se_z)_{4+q}$ can be controlled, for example, by varying the S:Se ratio in the kesterite material. For z=1 (pure Se material), the band gap is approximately 1.0 eV. For z=0 (pure S material), the band gap is approximately 1.5 eV. For intermediate values of "z" the band gap can therefore be tailored anywhere in between the values of 1.0 eV and 1.5 eV. Consequently, and gap grading can be established in the kesterite absorber layer by grading "z" as a function of depth in the film. The gradation in "z" can be established by choice of S:Se ratio in the capping layer (e.g., higher S content leads to more S incorporation in the kesterite film) and the temperature and duration of the heat treatment (or annealing) to which the capping layer and bulk layer are subjected (shorter times and lower temperatures lead to slower diffusion of the elements, making it easier to establish a sharper compositional gradient in the film).

According to an exemplary embodiment, the annealing conditions include a temperature of from about 300 degrees Celsius (° C.) to about 700° C., e.g., from about 400° C. to about 600° C. for a duration of from about 1 second to about 24 hours, for example, from about 20 seconds to about 2 hours, e.g., from about 1 minute to about 30 minutes. The anneal is preferably carried out in an atmosphere including at least one of: nitrogen ($N_2$), argon (Ar), helium (He), hydrogen ($H_2$), forming gas and mixtures thereof. This atmosphere can further include vapors of at least one of: S, Se, Sn and a compound(s) thereof including, but not limited to $H_2S$, $H_2Se$, SnS, SnSe, Sn(S,Se), $SnS_2$, $SnSe_2$, $Sn(S,Se)_2$. The atmosphere can still further include trace vapors (e.g., less than 1,000 parts per million (ppm)) of at least one of water or oxygen, though normally these components would be reduced to the lowest possible level to avoid excessive oxidation of the sample. The step of thermal treatment can be carried out either in a confined environment (substrate enclosed) or in an open environment (substrate not enclosed).

Figure 2:
FIG. 2 is a cross-sectional diagram illustrating a starting structure for fabricating a photovoltaic device, e.g., a substrate formed from a conductive material or a substrate coated with a layer of conductive material according to an embodiment of the present invention.

The present techniques may be employed in the fabrication of a photovoltaic device. See, for example, FIGS. 2-4. To begin the photovoltaic device fabrication process, a substrate 202 is provided. See FIG. 2. As highlighted above, suitable substrates include, but are not limited to, a metal foil substrate, a glass substrate, a ceramic substrate, aluminum foil coated with a (conductive) layer of molybdenum, a polymer substrate, and any combination thereof. Further, as described above, if the substrate material itself is not inherently conducting then the substrate is preferably coated with a conductive coating/layer. This situation is depicted in FIG. 2, wherein the substrate 202 has been coated with a layer 204 of conductive material. Suitable conductive materials for forming layer 204 include, but are not limited to, molybdenum (Mo), which may be coated on the substrate 202 using sputtering or evaporation.

Figure 3:
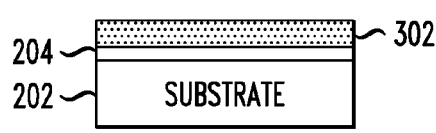
FIG. 3 is a cross-sectional diagram illustrating a kesterite film absorber layer having been formed on the substrate according to an embodiment of the present invention.
Figure 4:
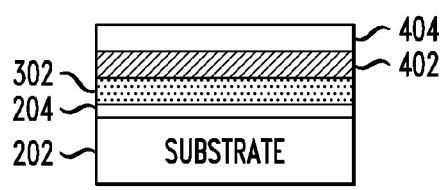
FIG. 4 is a cross-sectional diagram illustrating an n-type semiconducting layer having been formed on the kesterite film and a top electrode having been formed on the n-type semiconducting layer according to an embodiment of the present invention.

Next, as illustrated in FIG. 3, a kesterite film 302 is formed on the substrate 202. In the particular example shown in FIG. 3, the substrate 202 is coated with the conductive layer 204 and the kesterite film 302 is formed on the conductive layer 204. Kesterite layer 302 may be formed on the substrate 202 using the techniques described in conjunction with the description of methodology 100 of FIG. 1, above. The kesterite film 302 will serve as an absorber layer of the device.

An n-type semiconducting layer 402 is then formed on the kesterite layer 302. According to an exemplary embodiment, the n-type semiconducting layer 402 is formed from zinc sulfide (ZnS), cadmium sulfide (CdS), indium sulfide (InS), oxides thereof and/or selenides thereof, which is deposited on the kesterite layer 302 using for example vacuum evaporation, chemical bath deposition, electrochemical deposition, atomic layer deposition (ALD), and Successive Ionic Layer Adsorption And Reaction (SILAR). Next, a top electrode 404 is formed on the n-type semiconducting layer 402. As highlighted above, the substrate 202 (if inherently conducting) or the layer 204 of conductive material serves as a bottom electrode of the device. Top electrode 404 is formed from a transparent conductive material, such as doped zinc oxide (ZnO), indium-tin-oxide (ITO), doped tin oxide or carbon nanotubes. The process for forming an electrode from these materials would be apparent to one of skill in the art and thus is not described further herein.

The present invention further provides a photovoltaic module which includes a plurality of electrically interconnected photovoltaic devices described in the present invention. In particular, the module may be monolithically integrated using processes well known to those skilled in the art (as an example, see M. Powalla et al., "Large-Area CIGS Modules: Pilot Line Production and New Developments," International PVSEC-14, Bangkok, Thailand, Jan. 26-30, 2004; IN28V/ 18-1, the entire contents of which are incorporated by reference herein).

The present techniques are further described by way of reference to the following non-limiting examples.

EXAMPLE 1

A bulk layer was prepared according to the method described in U.S. Patent Application Publication No. 2011/ 0094557:

All operations were performed in a nitrogen-filled glove box. A solution for depositing the bulk precursor layer was prepared in two parts in glass vials under magnetic stirring: A1, by dissolving $Cu_2S$, 0.573 grams (g) and sulfur, 0.232 g in 3 milliliters (ml) of hydrazine and B1, by mixing SnSe, 0.790 g, Se, 1.736 g and Zn, 0.32 g with 7 ml of hydrazine. After 3 days under magnetic stirring, solution A1 had an orange transparent aspect, while solution B1 was dark green and opaque. Solutions A1 and B1 were mixed (to form solution C1) before deposition.

A solution (D1) for depositing a Sn-containing capping layer was prepared by dissolving 0.12 g SnS and 0.88 g Se in 4 ml of hydrazine.

A bulk precursor film was deposited on a soda lime glass substrate coated with 700 nm molybdenum by spin coating at 800 revolutions per minute (rpm) and heating the precursor film at 425° C. for 1 minute. The coating and heating cycle was repeated 5 times.

An over-layer of solution D1 was then spun on the top of the thus obtained bulk layer, thereby forming a capping layer (to a thickness of from about 300 nm to about 500 nm), and the whole stack (i.e., bulk layer and capping layer) was annealed at 540° C. on a ceramic hot plate, leading to a large-grained film (Sample M, see surface scanning electron micrograph (SEM) image of Sample M shown in FIG. 6). An image of this film produced using the capping layer is shown in FIG. 6. A control sample was prepared without Sn-containing over-layer (capping layer) (Sample N, see surface SEM image of Sample N shown in FIG. 5). As will be described in detail below, FIGS. 7 and 8 are cross-sectional images of completed baseline device from Sample N (FIG. 7) and a device with Sample M absorber processed with a capping layer (FIG. 8).

EXAMPLE 2

A bulk layer was prepared the same as in example 1 except for employing less selenium (1.405 g) in the solution B2, mixed with solution A1 to form solution C2. Capping solution E2 contained only selenium (0.880 g) in 4 ml of hydrazine.

Films were then prepared as described in conjunction with the description of Example 1, above: Sample P was prepared by spin coating 5 layers of solution B2. Sample Q was prepared by spin coating 5 layers of solution B2 and a layer of solution E2, containing only selenium. Sample R was prepared by spin coating 5 layers of solution B2 and a layer of solution D1, containing selenium and tin.

EXAMPLE 3

Figure 9:
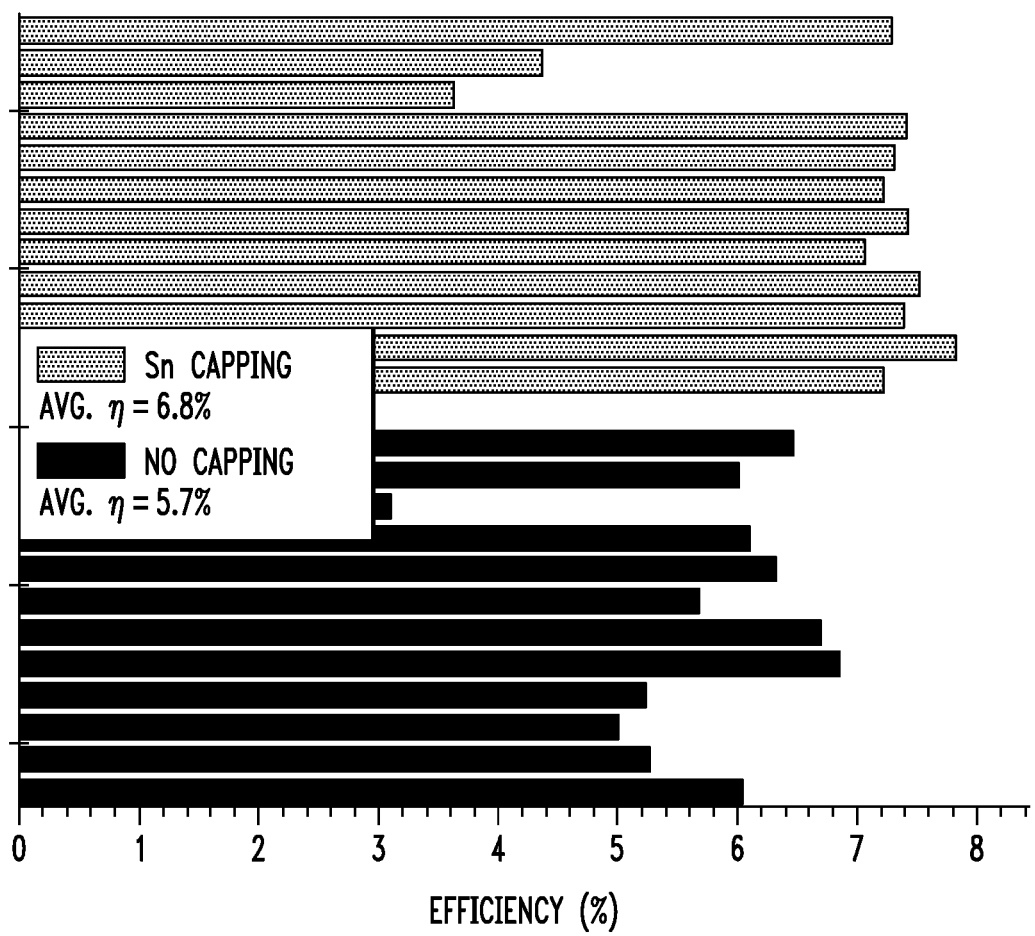
FIG. 9 is an efficiency distribution of samples prepared with no capping layer compared with samples prepared using the present techniques having capping layers containing tin (Sn) sulfur (S) and selenium (Se) according to an embodiment of the present invention.

Solar cells with approximate area of 0.45 square centimeters ($cm^2$) were fabricated from the obtained kesterite films sample P type and sample R type by deposition of 60 nm CdS buffer layer by chemical bath deposition, 100 nm insulating ZnO and 130 nm ITO (indium-doped zinc oxide) by sputtering. Statistically significant efficiency enhancement of 19% average was found when samples were treated with a capping layer. See FIG. 9. FIG. 9 is an efficiency distribution of all samples of type P prepared with no capping layer and all samples of type R prepared with SnS—Se capping layer.

A discussion of the example results now follows. FIGS. 5 and 7 present surface and cross-section SEM images, respectively, of films without a capping layer, which show grain size in the range of from about 1 micrometer to about 2 micrometers. FIGS. 6 and 8 present surface and cross-section SEM images, respectively, of identically processed films with SnS—Se capping layer D1 which show larger grain size in the range of from about 2 micrometers to about 5 micrometers.

Figure 10:
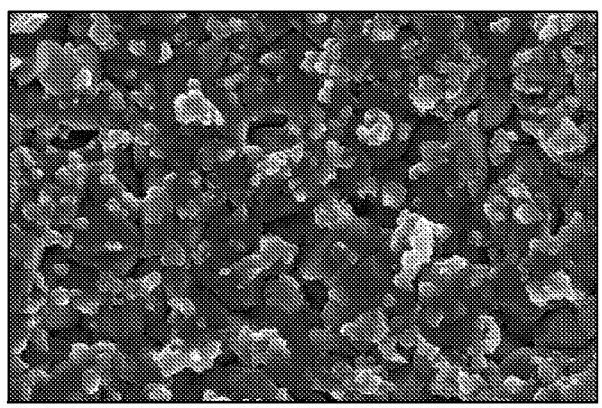
FIG. 10 is a surface SEM image of a film prepared from a solution with reduced Se content without using a capping layer according to an embodiment of the present invention.
Figure 11:
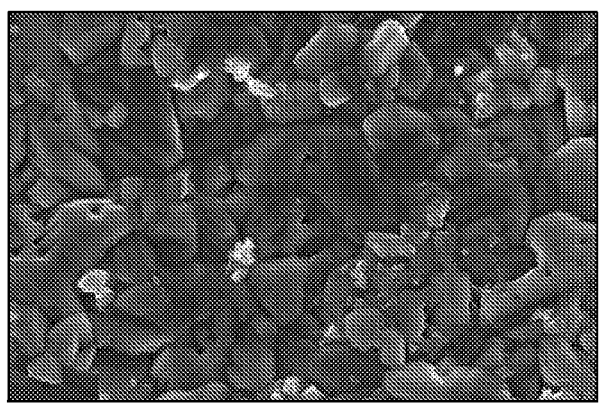
FIG. 11 is a surface SEM image of a film prepared from a solution with reduced Se content using a Se capping layer according to an embodiment of the present invention.
Figure 12:
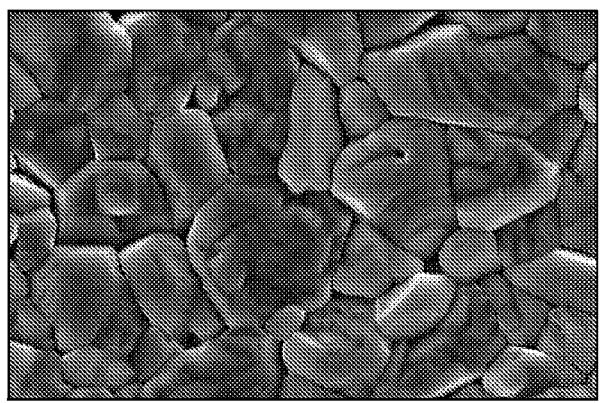
FIG. 12 is a surface SEM image of a film prepared from a solution with reduced Se content using an SnS—Se capping layer according to an embodiment of the present invention.

FIGS. 10-12 are SEM images of a film prepared from a solution with reduced selenium content without a capping layer (Sample P, see surface SEM image of Sample P shown in FIG. 10), with a Se capping layer (Sample Q, see surface SEM image of Sample Q shown in FIG. 11) and with SnS—Se capping layer (Sample R, see surface SEM image of Sample R shown in FIG. 12). The grain size increases in the sequence Sample P (from about 1 micrometer to about 2 micrometers)<Sample Q (from about 2 micrometers to about 3 micrometers)<Sample R (from about 2 micrometers to about 5 micrometers).

Sometimes it is desirable to reduce the amount of Se in the solution to reduce either the thickness of the resulting $MoSe_2$ layer that forms at the interface between the CZTSSe and Mo layers (more Se in solution leads to a thicker interfacial layer). Also, reducing the amount of Se in the solution can influence the amount of voiding that is observed at the interface between the Mo and CZTSSe. Thus, in this example, less Se was used in the bulk film.

Figure 13:
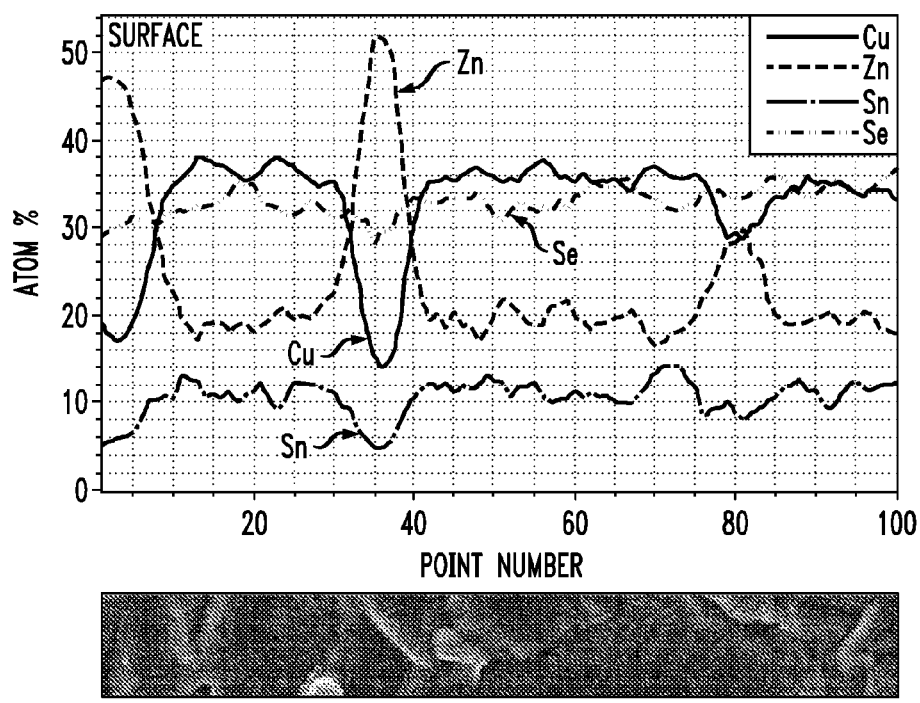
FIG. 13 is a surface energy dispersive spectrometer (EDS) scan of a sample film prepared without using a capping layer according to an embodiment of the present invention.
Figure 14:
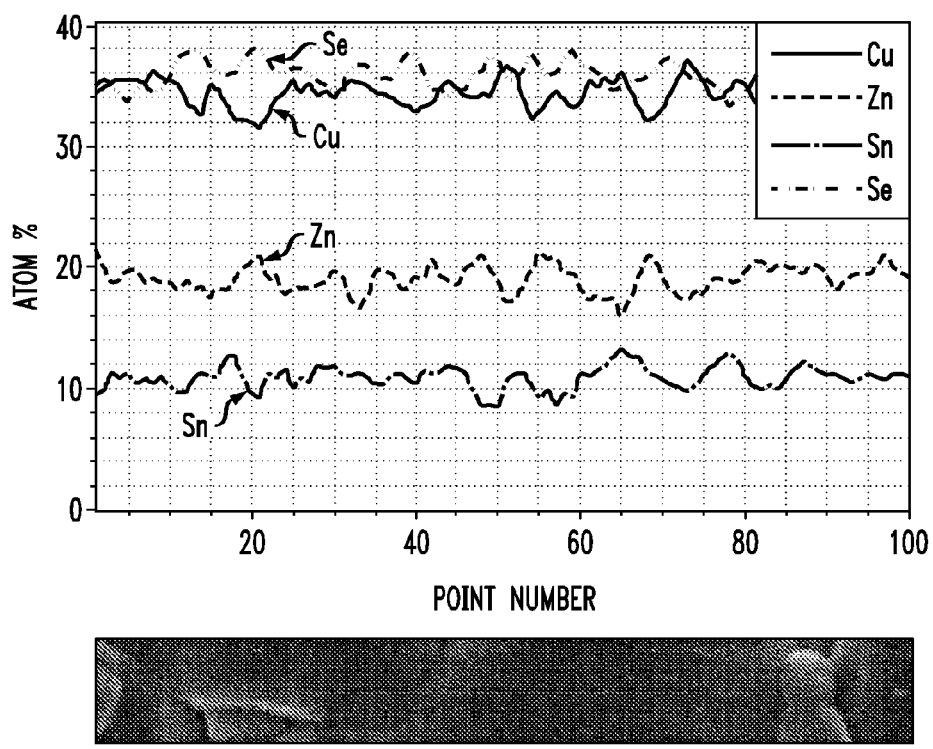
FIG. 14 is a surface EDS scan of a sample film prepared using a Sn—Se capping layer according to an embodiment of the present invention.
Figure 15:
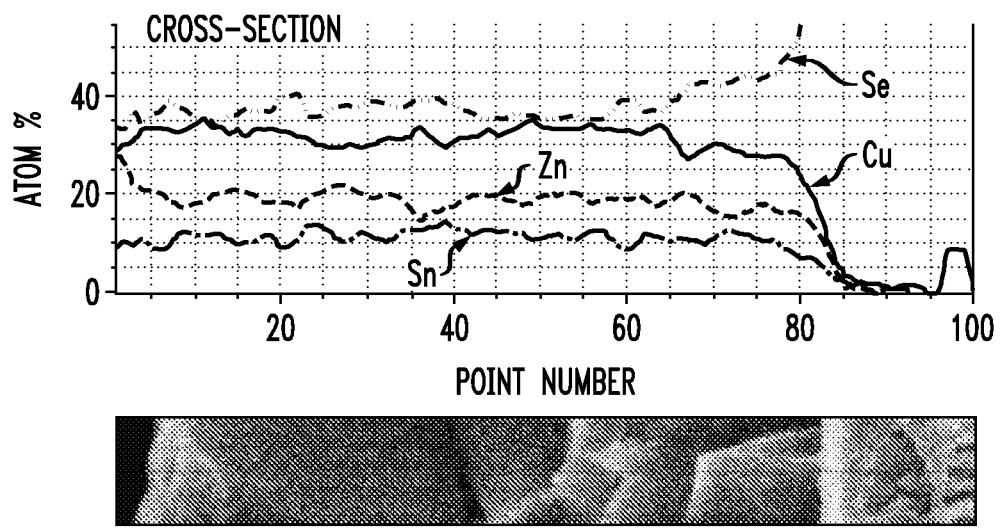
FIG. 15 is a cross-sectional EDS scan of the sample film prepared without using a capping layer according to an embodiment of the present invention.
Figure 16:
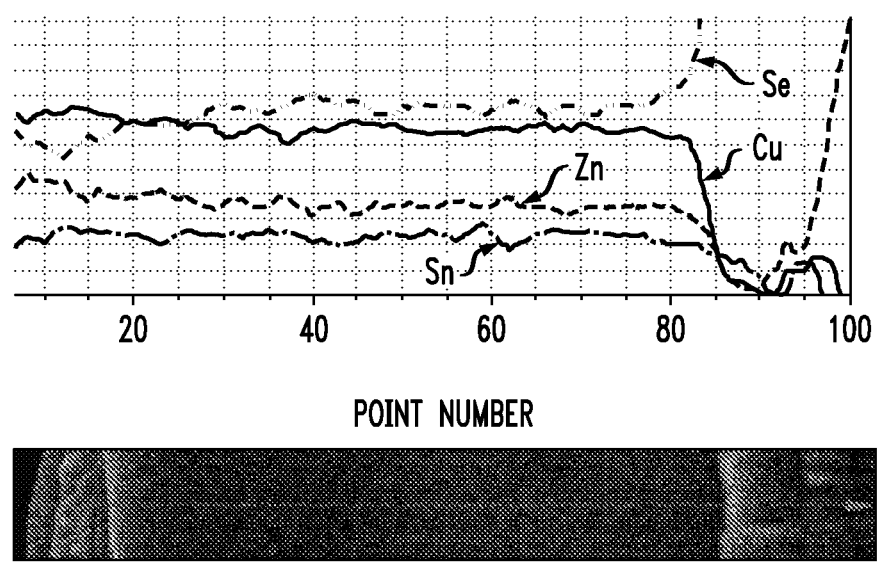
FIG. 16 is a cross-sectional EDS scan of the sample film prepared using the Sn—Se capping layer according to an embodiment of the present invention.

In addition to the enhanced bulk crystallization effect, smaller grain formations are observed on the surface of sample P, to a lesser extent on sample Q and are completely eliminated in Sample R, with the combined action of the SnS and Se in the capping layer. Energy dispersive spectrometer (EDS) analysis of a surface of Sample M without a capping layer shows non-uniform elemental distribution, including Zn-rich zones (see surface EDS scan of sample M in FIG. 13) while the Sn—Se capped films show more uniform compositional profile (see surface EDS scan of sample N in FIG. 14). Cross-sectional scans of these samples (see cross-sectional EDS scan of sample M in FIG. 15 and cross-sectional scan of sample N in FIG. 16) do not show significant difference in the bulk composition as a result of the Sn-containing capping layer in this case.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a kesterite film having a formula $Cu_{2-x}Zn_{1+y}Sn(S_{1-z}Se_z)_{4+q}$, wherein $0 \leq x \leq 1$; $0 \leq y \leq 1$; $0 \leq z \leq 1$; and $-1 \leq q \leq 1$, the method comprising the steps of:
   providing a substrate;
   forming a bulk precursor layer on the substrate, the bulk precursor layer comprising Cu, Zn, Sn and at least one of S and Se, wherein the bulk precursor layer is an only source of Cu and Zn in the kesterite film such that a composition of Cu and Zn in the kesterite film is determined by a composition of Cu and Zn in the bulk precursor layer;
   analyzing the bulk precursor layer formed on the substrate to determine a composition of the bulk precursor layer;
   forming a solid capping layer on the bulk precursor layer, the capping layer comprising at least one of Sn, S and Se, wherein the capping layer is configured to provide a source of additional elemental chalcogen at a surface of the kesterite film; and
   annealing the bulk precursor layer and the capping layer under conditions sufficient to produce the kesterite film having values of x, y, z and q for any given part of the film that deviate from average values of x, y, z and q throughout the film by less than 20 percent such that a composition of the kesterite film in terms of x, y, z and q is $0 \leq x \leq 1$; $0 \leq y \leq 1$; $0 \leq z \leq 1$; and $-1 \leq q \leq 1$, wherein the capping layer serves to replace elements lost from the bulk precursor layer during the annealing step such that a composition and a thickness of the capping layer is based on the composition of the bulk precursor layer determined prior to forming the capping layer such that the kesterite film is produced having the formula $Cu_{2-x}Zn_{1+y}Sn(S_{1-z}Se_z)_{4+q}$,
   wherein the capping layer is configured to provide a chalcogen-rich layer during the annealing step to control a grain size of the kesterite film, and a solid barrier on the bulk precursor layer to prevent elemental loss from the bulk precursor during the annealing step.

2. The method of claim 1, wherein the substrate comprises a metal foil substrate, a glass substrate, a ceramic substrate, aluminum foil and a polymer substrate.

3. The method of claim 1, wherein the bulk precursor layer is formed by depositing Cu, Zn, Sn and at least one of S and Se all together onto the substrate using solution coating, evaporation, electrochemical deposition or sputtering.

4. The method of claim 3, wherein the bulk precursor layer is formed by the steps of:
   forming a solution or dispersion comprising Cu, Zn, Sn and least one of S and Se in a solvent; and
   depositing the solution or dispersion on the substrate.

5. The method of claim 4, wherein the solution is deposited on the substrate using a solution coating process selected from the group consisting of: spin coating, dip coating, doctor blading, curtain coating, slide coating, spraying, slit casting, meniscus coating, screen printing, ink jet printing, pad printing, flexography, and gravure printing.

6. The method of claim 1, wherein the bulk precursor layer is formed by depositing a stack of layers on the substrate, each of the layers containing only one of the Cu, the Zn, the Sn and the at least one of S and Se, and wherein each of the layers is deposited using solution coating, evaporation, electrochemical deposition or sputtering.

7. The method of claim 1, wherein the bulk precursor layer is formed on the substrate to a thickness of from about 100 nanometers to about 5 micrometers.

8. The method of claim 1, wherein the capping layer is formed on the bulk precursor layer by the steps of:
   dissolving at least one of Sn, S and Se in a solvent to form an ink; and
   depositing the ink on the bulk precursor layer to form the capping layer.

9. The method of claim 8, wherein the solvent is selected from the group consisting of hydrazine and hydrazine-water mixtures, with hydrazine content from about 0.1% to about 99.9%.

10. The method of claim 8, wherein the ink is deposited on the bulk precursor layer using a solution coating process selected from the group consisting of:
spin coating, dip coating, doctor blading, curtain coating, slide coating, spraying, slit casting, meniscus coating, screen printing, ink jet printing, pad printing, flexography, and gravure printing.

11. The method of claim 1, wherein the capping layer is formed on the bulk precursor layer to a thickness of from about 10 nanometers to about 3 micrometers.

12. The method of claim 1, wherein the capping layer comprises only one of S and Se.

13. The method of claim 1, wherein the conditions include temperature and duration.

14. The method of claim 13, wherein the temperature is from about 300° C. to about 700° C.

15. The method of claim 13, wherein the duration is from about 1 second to about 24 hours.

16. The method of claim 1, wherein the bulk precursor layer and the capping layer are annealed in an environment containing at least one of nitrogen, argon, helium, hydrogen, forming gas, S vapor, Se vapor, Sn vapor, water vapor and oxygen vapor.

17. The method of claim 1, wherein the bulk precursor layer is an only source of Sn in the kesterite film.

18. The method of claim 1, wherein a composition of the bulk precursor layer is configured such that values of x, y, z and q in the formula $Cu_{2-x}Zn_{1+y}Sn(S_{1-z}Se_z)_{4+q}$ differ by 50 percent or less from the bulk precursor layer to the kesterite film.

19. The method of claim 1, wherein the capping layer comprises from about 50 percent to about 90 percent Se, from about 1 percent to about 50 percent S, and from about 1 percent to about 50 percent Sn.

20. The method of claim 1, wherein a ratio of either Se to Sn or S to Sn in the capping layer is 2:1.

21. A method of fabricating a kesterite film having a formula $Cu_{2-x}Zn_{1+y}Sn(S_{1-z}Se_z)_{4+q}$, wherein $0 \le x \le 1$; $0 \le y \le 1$; $0 \le z \le 1$; and $-1 \le q \le 1$, the method comprising the steps of:

providing a substrate;

forming a bulk precursor layer on the substrate, the bulk precursor layer comprising Cu, Zn, and at least one of S and Se, wherein the bulk precursor layer is an only source of Cu and Zn in the kesterite film such that a composition of Cu and Zn in the kesterite film is determined by a composition of Cu and Zn in the bulk precursor layer;

analyzing the bulk precursor layer formed on the substrate to determine a composition of the bulk precursor layer;

forming a solid capping layer on the bulk precursor layer, the capping layer comprising Sn, S and Se, wherein the capping layer is an only source of Sn in the kesterite film such that the bulk precursor layer is not a kesterite, wherein the capping layer is configured to provide a source of additional elemental chalcogen at a surface of the kesterite film; and annealing the bulk precursor layer and the capping layer under conditions sufficient to produce the kesterite film having values of x, y, z and q for any given part of the film that deviate from average values of x, y, z and q throughout the film by less than 20 percent such that a composition of the kesterite film in terms of x, y, z and q and q is $0 \le x \le 1$; $0 \le y \le 1$; $0 \le z \le 1$; and $-1 \le q \le 1$, wherein the capping layer serves to replace elements lost from the bulk precursor layer during the annealing step such that a composition and a thickness of the capping layer is based on the composition of the bulk precursor layer determined prior to forming the capping layer such that the kesterite film is produced having the formula $Cu_{2-x}Zn_{1+y}Sn(S_{1-z}Se_z)_{4+q}$, wherein the capping layer is configured to provide a chalcogen-rich layer during the annealing step to control a grain size of the kesterite film, and a solid barrier on the bulk precursor layer to prevent elemental loss from the bulk precursor during the annealing step.

* * * * *